US010553428B2

(12) United States Patent
Chen et al.

(10) Patent No.: US 10,553,428 B2
(45) Date of Patent: Feb. 4, 2020

(54) REFLECTION MODE PHOTOMASK AND FABRICATION METHOD THEREFORE

(71) Applicant: TAIWAN SEMICONDUCTOR MANUFACTURING COMPANY, LTD., Hsinchu (TW)

(72) Inventors: Chun-Lang Chen, Madou Township (TW); Chih-Chiang Tu, Tauyen (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 4 days.

(21) Appl. No.: 15/682,849

(22) Filed: Aug. 22, 2017

(65) Prior Publication Data

US 2019/0067007 A1    Feb. 28, 2019

(51) Int. Cl.
| *G03F 1/24* | (2012.01) |
| *G03F 1/46* | (2012.01) |
| *H01L 21/033* | (2006.01) |
| *H01L 21/027* | (2006.01) |

(52) U.S. Cl.
CPC ............ *H01L 21/0332* (2013.01); *G03F 1/24* (2013.01); *G03F 1/46* (2013.01); *H01L 21/0276* (2013.01)

(58) Field of Classification Search
None
See application file for complete search history.

(56) References Cited

U.S. PATENT DOCUMENTS

| 7,390,596 | B2 * | 6/2008 | Ishibashi | ............... | B82Y 10/00 |
| | | | | | 428/430 |
| 2001/0051304 | A1 * | 12/2001 | Stivers | ................... | B82Y 10/00 |
| | | | | | 430/5 |
| 2008/0318139 | A1 * | 12/2008 | Dersch | ................... | B82Y 10/00 |
| | | | | | 430/5 |
| 2009/0214961 | A1 * | 8/2009 | Nozawa | .................... | G03F 1/46 |
| | | | | | 430/5 |
| 2010/0266938 | A1 * | 10/2010 | Hosoya | ................. | B82Y 10/00 |
| | | | | | 430/5 |
| 2013/0156939 | A1 * | 6/2013 | Budach | .................. | B82Y 10/00 |
| | | | | | 427/8 |
| 2013/0157388 | A1 * | 6/2013 | Grimbergen | ............ | H01L 22/12 |
| | | | | | 438/9 |
| 2013/0316272 | A1 * | 11/2013 | Hayashi | ................... | G03F 1/24 |
| | | | | | 430/5 |

(Continued)

FOREIGN PATENT DOCUMENTS

| TW | 201001059 | 1/2010 |
| TW | 201435481 | 9/2014 |

(Continued)

OTHER PUBLICATIONS

Office Action dated Dec. 5, 2018 from corresponding application No. TW 106135972.

(Continued)

*Primary Examiner* — Martin J Angebranndt
(74) *Attorney, Agent, or Firm* — Hauptman Ham, LLP

(57) ABSTRACT

A method of fabricating a mask blank includes depositing a reflective multilayer over a substrate, depositing a capping layer over the reflective multilayer, depositing an absorber layer over the capping layer, and depositing an anti-reflective coating (ARC) layer over the absorber layer. The ARC layer is a single material film.

14 Claims, 6 Drawing Sheets

(56) References Cited

U.S. PATENT DOCUMENTS

| | | | |
|---|---|---|---|
| 2014/0154615 A1* | 6/2014 | Yu | G03F 1/00 |
| | | | 430/5 |
| 2014/0186752 A1* | 7/2014 | Kinoshita | G03F 1/24 |
| | | | 430/5 |
| 2014/0186753 A1* | 7/2014 | Okamura | G03F 1/24 |
| | | | 430/5 |
| 2014/0205936 A1* | 7/2014 | Kodera | G03F 1/24 |
| | | | 430/5 |
| 2014/0212794 A1* | 7/2014 | Maeshige | G03F 1/24 |
| | | | 430/5 |
| 2014/0272677 A1* | 9/2014 | Raghunathan | G03F 7/2022 |
| | | | 430/5 |
| 2015/0160548 A1* | 6/2015 | Mikami | G03F 1/24 |
| | | | 430/5 |
| 2015/0198874 A1* | 7/2015 | Ikuta | G03F 1/24 |
| | | | 430/5 |
| 2017/0176851 A1* | 6/2017 | Peters | G03F 1/22 |
| 2018/0149962 A1* | 5/2018 | Kobayashi | G03F 1/54 |

FOREIGN PATENT DOCUMENTS

| | | | | |
|---|---|---|---|---|
| TW | 201708941 | | 3/2017 | |
| WO | 2016/204051 | * | 12/2016 | G03F 1/24 |

OTHER PUBLICATIONS

Office Action dated Jun. 26, 2019 from corresponding application No. TW 106135972.

* cited by examiner

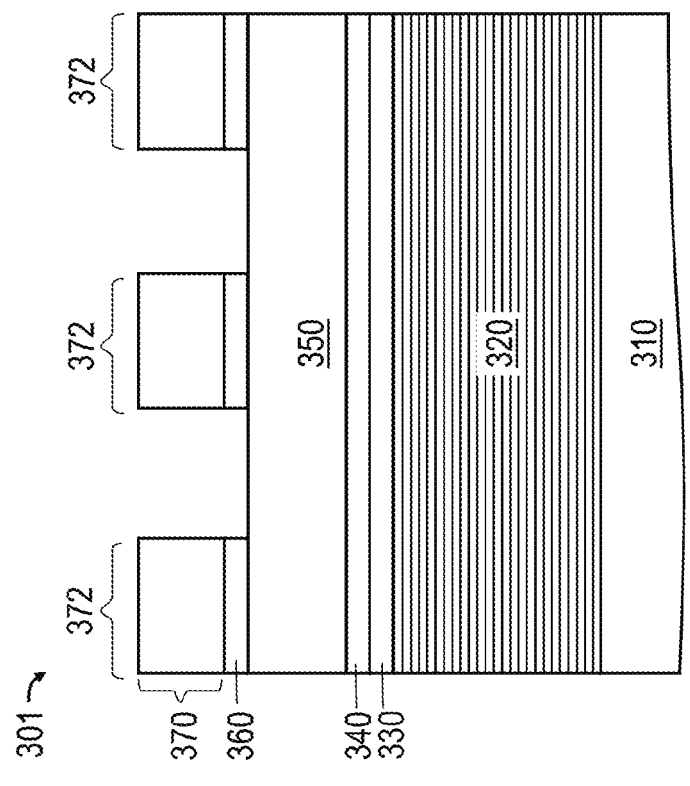
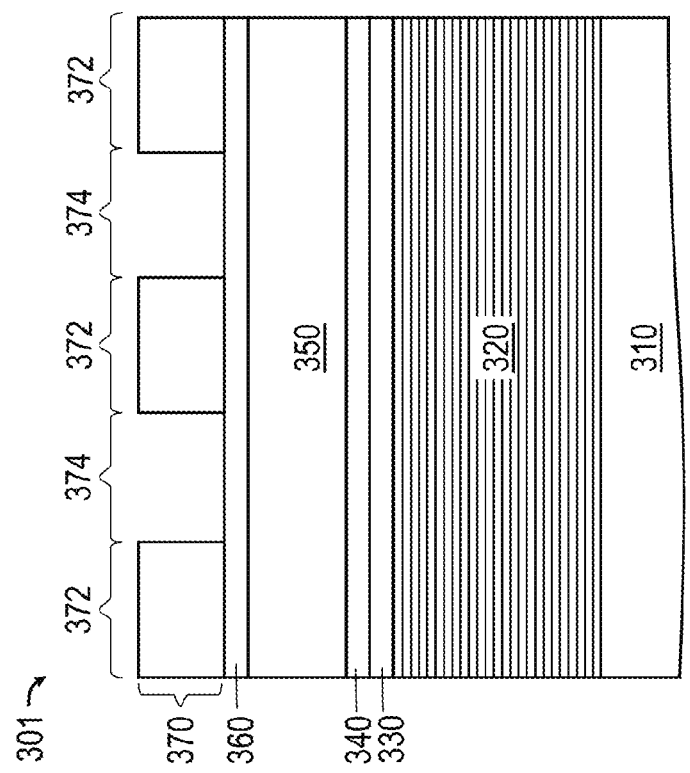

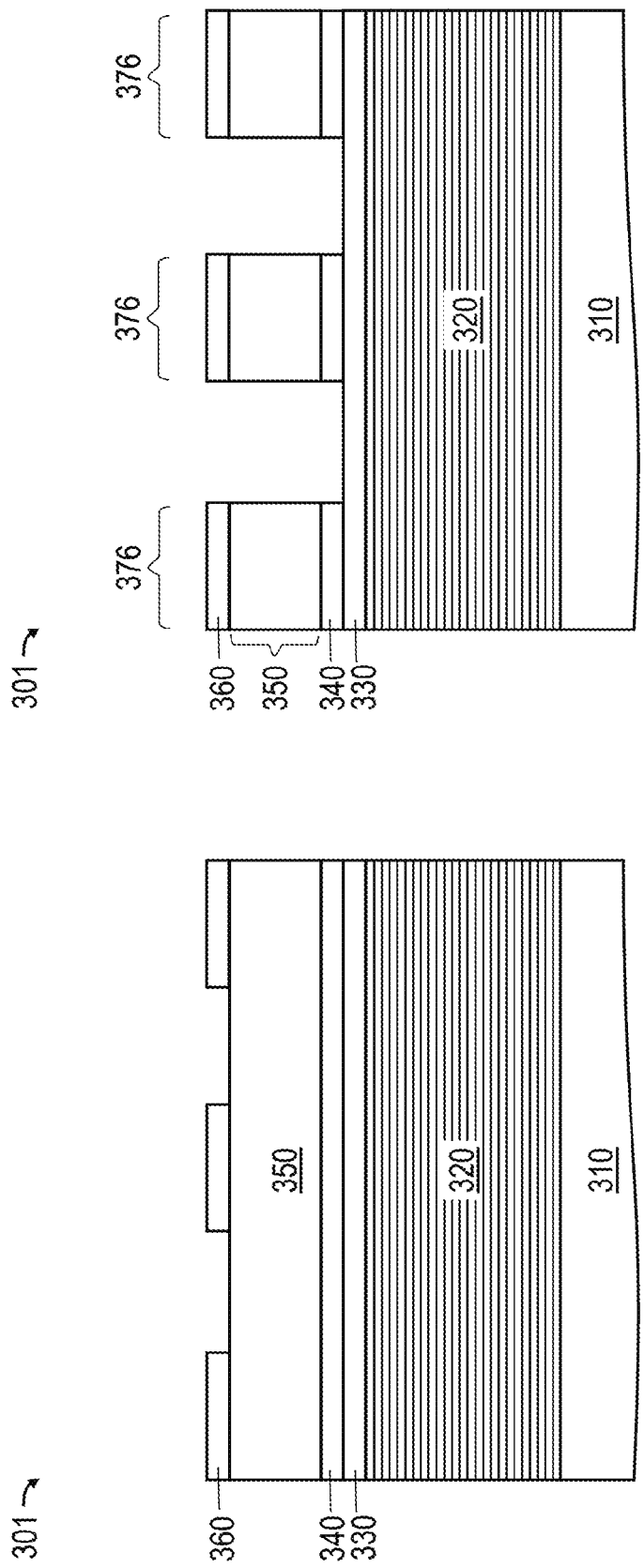

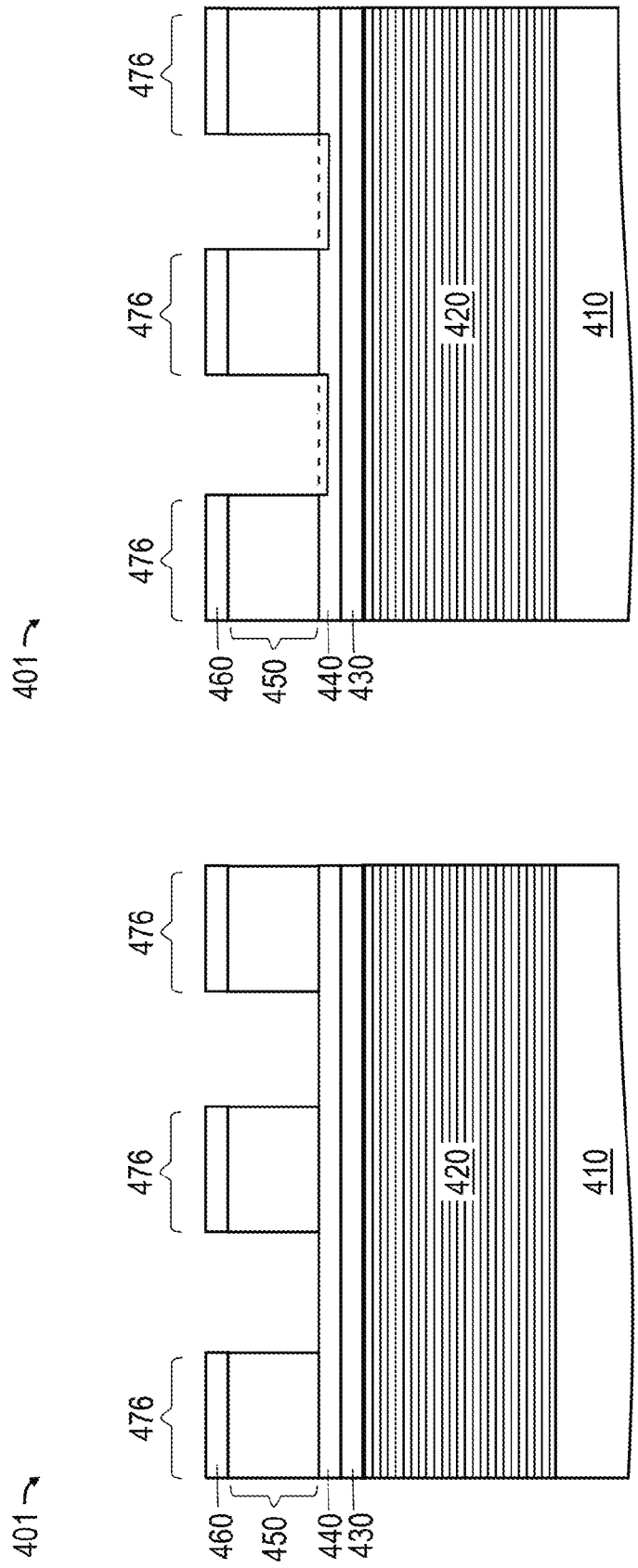

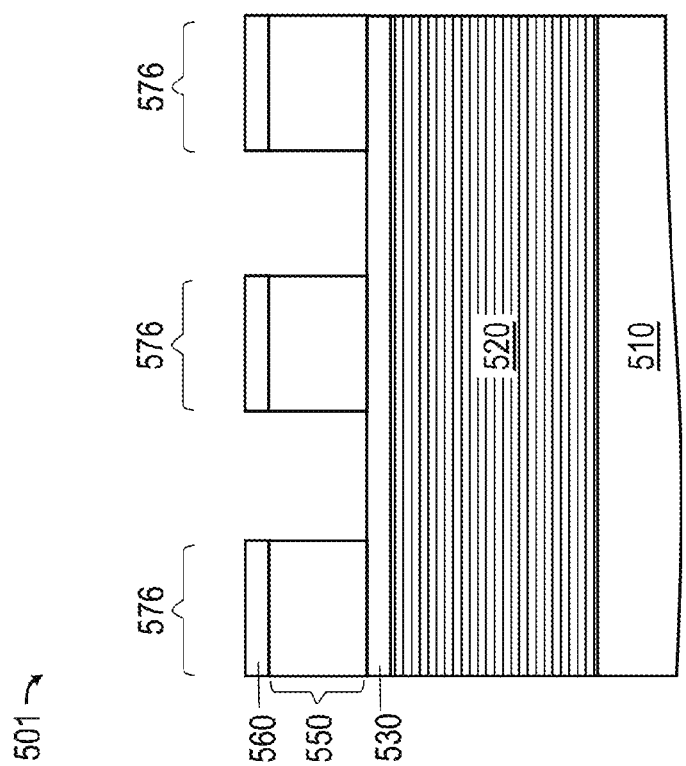

REFLECTION MODE PHOTOMASK AND FABRICATION METHOD THEREFORE

BACKGROUND

Lithography is utilized in the fabrication of semiconductor devices to transfer a pattern onto a wafer. Based on various integrated circuit (IC) layouts, patterns of a mask are reduced by a factor of 2:1 or 4:1 in order to transfer the pattern to a surface of the wafer. The mask, also called a reticle, is made of a substrate with one or more opaque materials deposited on one side to block penetration of a lithographic radiation. A clear region is configured to reflect or transmit the lithographic radiation. As dimensions decrease and density in IC chips increases, resolution enhancement techniques, such as extreme ultraviolet (EUV) exposure, phase-shift mask (PSM), optical proximity correction (OPC), off-axis illumination (OAI) and double dipole lithography (DDL), are developed to improve depth of focus (DOF) and to achieve a more precise pattern transfer onto the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are cross-sectional views of a reflection mode mask at various stages of manufacturing in accordance with one or more embodiments.

FIGS. 4A-4B are cross-sectional views of a reflection mode mask in accordance with one or more embodiments.

FIG. 5 is a cross-sectional view of a reflection mode mask in accordance with one or more embodiments.

DETAILED DESCRIPTION

Figure 1:
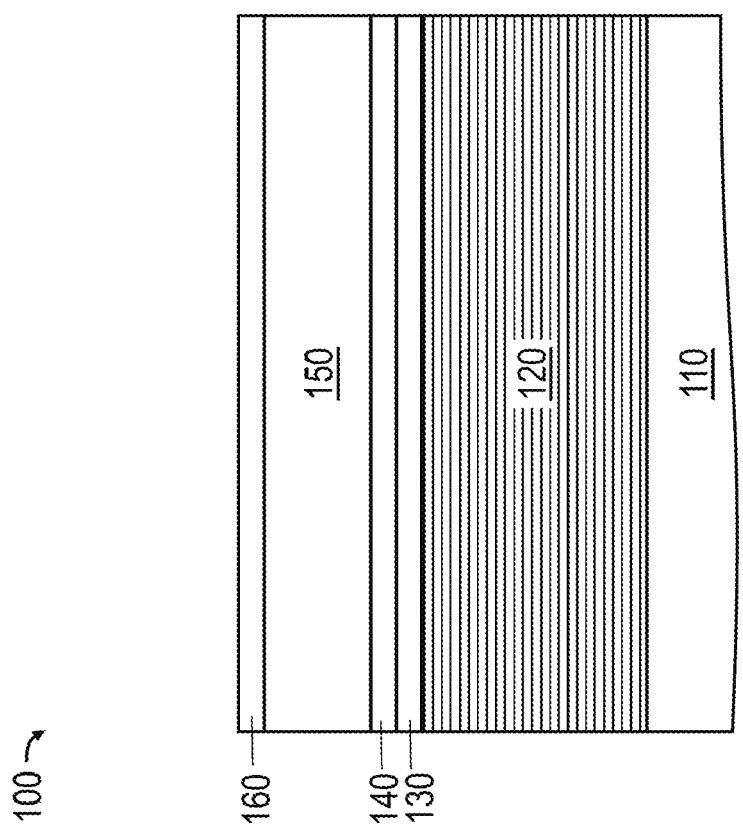
FIG. 1 is a cross-sectional view of a reflection mode mask blank in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

A scaling down process generally provides benefits by increasing production efficiency and lowering associated costs. However, as semiconductor device feature sizes have decreased to be smaller than a wavelength of a radiation used in lithography processes, the ability to manufacture the minimum feature size, also called critical dimensions (CD), becomes more sensitive to optical fringing of light passing through a mask or a reticle. In order to advance the fabrication requirement of such minimum feature size, a higher resolution lithography process is performed. Reflective mode lithography uses a radiation source such as extreme ultraviolet (EUV), x-ray, laser, ion beam, or electron beam (e-beam). Reflection mode lithography uses light reflected by the mask or reticle to pattern the wafer.

The following description is related to EUV lithography; however, one of ordinary skill in the art would recognize that a different wavelength of light is also applicable to this description. The EUV lithography employs a radiation source using light in a range of EUV wavelengths of approximately 13.5 nanometers (nm). In some embodiments, an EUV scanner provides a 4× reduction projection printing, similar to some optical scanners, except that the scanners use reflective rather than refractive optics, (i.e., mirrors instead of lenses). During a mask fabrication process, each of a plurality of absorber stacks corresponding to an opaque, light-shielding region, includes an absorber layer which is configured to absorb the radiation in a predetermined wavelengths projected onto a wafer and an anti-reflective coating (ARC) layer which is configured to help prevent reflected out-of-band radiation from being absorbed.

The ARC layer is also configured to function as a hard mask layer (also referred to as a self-mask layer). In particular, a ratio of a thickness of the ARC layer to the absorber layer is in a range from about 0.015 to 0.075. A thickness of the ARC layer ranges from about 1 nm to about 5 nm. A greater or a smaller ratio between the thickness of the ARC layer and the thickness of the absorber layer will decrease a contrast and a resolution of the pattern image, in some instances. In some approaches, the mask is free of a chromium-containing hard mask layer over the absorber layer. Therefore, a photoresist is directly coated over a top surface of a top-most ARC layer to define an image pattern. As a result, the fabrication process reduces at least one pattern transfer step, which helps to reduce contaminants and/or particles in the final mask product, and saves associated cost and time during subsequent processes. A fabrication process time and cost are therefore reduced in comparison with other approaches. In some approaches, an etch stop layer is deposited over a capping layer in order to help protect the capping layer from being damaged during a series of etch and cleaning processes. As a result, the capping layer has a more uniform surface in comparison with other approaches, thereby reducing an energy loss of radiation reflected by the mask during the lithography process.

FIG. 1 is a cross-sectional view of a reflection mode mask blank 100 in accordance with one or more embodiments. Reflection mode mask blank 100 includes a substrate 110, a reflective multilayer 120, a capping layer 130, an etch stop layer 140, an absorber layer 150 and an ARC layer 160.

Reflection mode mask blank 100 is configured to reflect radiation having a predetermined range of wavelength, such as deep ultraviolet (DUV) (from about 100 nm to about 300 nm) or EUV (from about 13.2 nm to about 13.8 nm). In some embodiments, substrate 110 includes a low thermal expansion (LTE) material, such as a titanium doped silica. In some embodiments, substrate 110 includes LTE glass, fused quartz, silicon carbide, carbonado or another appropriate material. In some embodiments, substrate 110 has a thickness ranging from about 6.3 millimeters (mm) to about 6.7 mm. A greater thickness increases manufacturing cost without a significant benefit, in some instances. A smaller thickness increases a risk of deforming reflection mode mask blank 100, in some instances. Reflective multilayer 120 is over substrate 110 and includes a plurality of alternating layers of a relatively high refractive index for radiation scattering and a relatively low refractive index for radiation transmitting. Pairing these two type materials together provides a resonant reflectivity. In some embodiments, reflective multilayer 120 includes multiple molybdenum/silicon pairs (e.g., a layer of molybdenum above or below a layer of silicon in each pair) or multiple molybdenum compound/silicon compound pairs. In some embodiments, reflective multilayer 120 includes multiple molybdenum/beryllium pairs or another appropriate materials having refractive index difference to cause a high reflectivity (e.g., from about 60% to about 70%) to a selected radiation. In some embodiments, each layer of reflective multilayer 120 has a thickness from about 4 nm to about 8 nm, with a total thickness of approximately 300 nm. The thickness is adjusted to achieve a maximum constructive interference of the selected radiation diffracted at each interface and a minimum absorption of the selected radiation thereof. A greater or a smaller thickness decreases a reflectivity, in some instances. In some embodiments, reflective multilayer 120 includes from about 20 to about 70 pairs of layers. A fewer number of pairs decreases a reflectivity, in some instances. A greater number of pairs increases a likelihood of contacting foreign particles and/or an occurrence of defects, in some instances. In some embodiments where reflective multilayer 120 includes molybdenum and silicon, a number of pairs is 40. In at least one embodiment, substrate 110 further includes a backside coating layer (not shown) on an opposite side from reflective multilayer 120. In some instances, the backside coating layer is a metallic film or a polycrystalline silicon film.

Capping layer 130 is over reflective multilayer 120 and is configured to serve as a protective layer to help prevent reflective multilayer 120 from being removed during a patterning process and/or a repairing process. Capping layer 130 is transparent to the selected range of wavelengths during a lithography process. For example, ruthenium is transparent to EUV radiation. In some embodiments, capping layer 130 helps to extend a lifetime of a mask. In some embodiments, capping layer 130 helps to prevent reflective multilayer 120 from being oxidized. In some embodiments, capping layer 130 includes ruthenium, ruthenium compound, silicon compound, chromium oxide, a combination thereof or another appropriate material. In some embodiments where capping layer 130 includes ruthenium, a thickness of capping layer 130 is in a range from about 2 nm to about 4 nm. A greater thickness decreases a reflectivity, in some instances. A smaller thickness provides insufficient chemical resistance during a fabrication process, in some instances. In various embodiments, capping layer 130 is also referred to as a buffer layer.

Etch stop layer 140 is over capping layer 130 and is configured to provide an early warning in order to help prevent excess removal of capping layer 130. Etch stop layer 140 is transparent to the selected range of wavelengths during a lithography process. In some embodiments, etch stop layer 140 is configured to reflect light at a wavelength from about 200 nm to about 350 nm. In some embodiments where an etchant is a mixture of chlorine gas and oxygen, a ratio of an etch selectivity of etch stop layer 140 to that of capping layer 130 is equal to or smaller than 1:20. A greater ratio provides insufficient process window during an etch process and/or a cleaning process, in some instances. In some embodiments where capping layer 130 includes ruthenium, etch stop layer 140 includes silicon, silicon compound or another appropriate material. In some embodiments, a thickness of etch stop layer is in a range from about 2 nm to about 5 nm. A greater thickness decreases a reflectivity, in some instances. A smaller thickness provides insufficient chemical resistance during a fabrication process, in some instances.

Absorber layer 150 is over etch stop layer 140 and is configured to absorb a selected radiation during a lithography process. When exposed to the selected radiation, a mask pattern with absorber layer 150 represents a dark tone region (e.g., an opaque, light-shielding region). In some embodiments where the lithographic radiation is EUV, absorber layer 150 includes a tantalum compound, such as tantalum boron nitride, tantalum oxynitride or tantalum silicon oxynitride. Depending on whether etch stop layer 140 is intended to be removed, a ratio of an etch selectivity of absorber layer 150 to that of etch stop layer 140 is in a range from about 4:1 to about 6:1. If etch stop layer 140 is intended to be removed, the ratio ranges from about 4:1 to about 5:1. In view of the thickness of etch stop layer 140, a smaller ratio provides insufficient process window during an etch process and/or a cleaning process, in some instances. A greater ratio increases a manufacturing processing time, in some instances. If etch stop layer 140 is intended to remain, the ratio ranges from about 5:1 to about 6:1. A smaller ratio provides insufficient process window, in some instances. In some embodiments, absorber layer 150 has a thickness in a range from about 62 nm to about 70 nm. A greater thickness increases a stress over reflective multilayer 120, reducing a lifetime of a mask, in some instances. A smaller thickness provides insufficient absorption, in some instances. In at least one embodiment where absorber layer 150 includes tantalum boron nitride, the thickness of absorber layer 150 is approximately 66 nm.

ARC layer 160 is over absorber layer 150 and is configured to reduce a reflection of a radiation during an optical microscopic inspection process after a fabrication of a mask product. The optical microscopic inspection operates in a wide electromagnetic spectrum, such as DUV. As a result, ARC layer 160 is able to reduce a reflection during a DUV inspection. ARC layer 160 is further configured to serve as a hard mask layer, defining an image pattern during the fabrication process. In consideration of a volatility of a chemical compound and byproducts therefor, ARC layer 160 and absorber layer 150 are metal compounds having a similar chemical composition. For example, in some embodiments where absorber layer 150 includes tantalum boron nitride, ARC layer 160 includes tantalum boron oxide; in some embodiments where absorber layer 150 includes tantalum oxynitride, ARC layer 160 includes tantalum nitride; in some embodiments where absorber layer 150 includes tantalum silicon oxynitride, ARC layer 160 includes tantalum silicon. As a result, a CD bias between an after-etch inspection (AEI) CD of ARC layer 160 and AEI CD of absorber layer 150 is reduced and a pattern transfer fidelity is improved in comparison with other approaches. One of ordinary skill in the art would understand that absorber layer 150 includes chromium compounds or nickel compounds, in some embodiments. In some embodiments, a ratio of a thickness of ARC layer 160 to absorber layer 150 is in a range from about 0.015 to 0.075. A greater ratio increases a risk of consuming an entirety of ARC layer 160 during a subsequent etch process, in some instances. A smaller ratio increases oxide byproduct when etching the ARC layer, increasing a risk of an undercut profile in the absorber stack, in some instances. A smaller ratio also provides insufficient radiation absorption, in some instances. ARC layer 160 has a thickness in a range from about 1 nm to about 5 nm. A greater thickness increases a manufacturing cost/time without a significant advantage, in some instances. A smaller thickness decreases a reflection of radiation, in some instances. Accordingly, ARC layer 160 is thinner than that manufactured by other approaches and therefore applies a smaller stress over reflective multilayer 120, thereby both reducing a surface deformation and increasing a lifetime of a mask.

Figure 2:
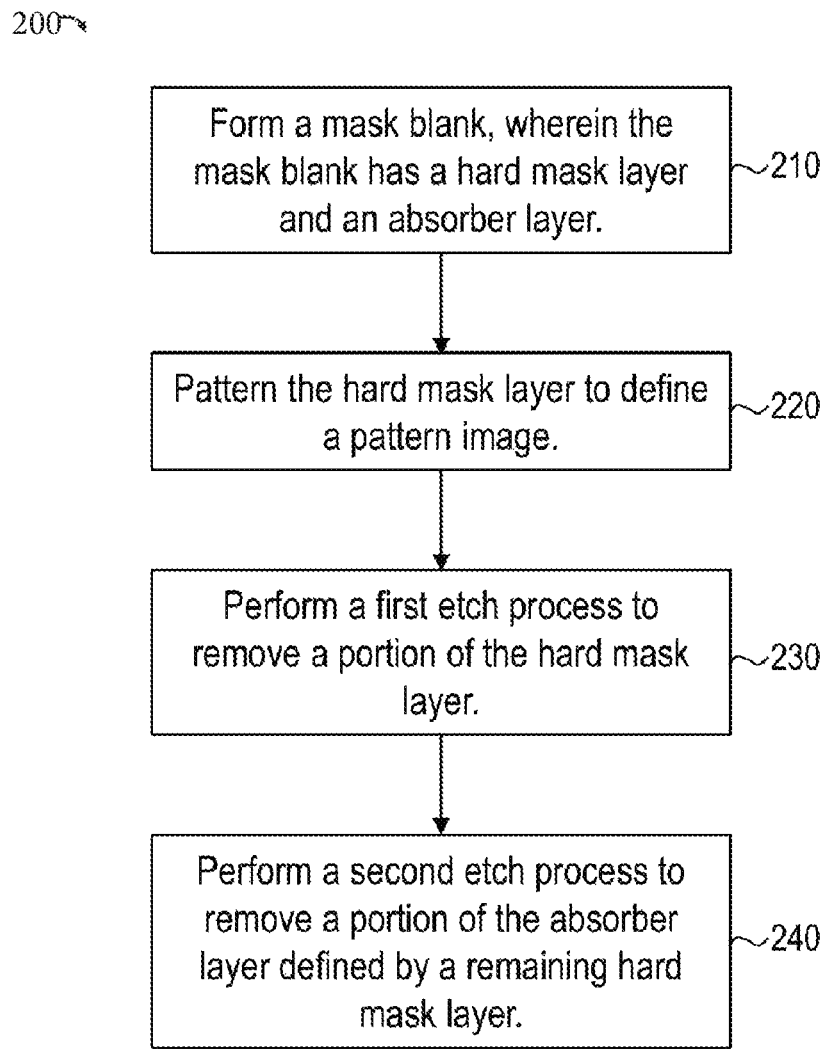
FIG. 2 is a flow chart of a method of fabricating a reflection mode mask in accordance with one or more embodiments.

FIG. 2 is a flow chart of a method 200 of fabricating a reflection mode mask in accordance with one or more embodiments. One of ordinary skill in the art would understand that additional operations are able to be performed before, during, and/or after method 200 depicted in FIG. 2. Additional details of the fabricating process are provided below with respect to FIGS. 3A-3D, in accordance with some embodiments.

Method 200 includes operation 210 in which a mask blank, i.e., reflection mode mask blank 100 in FIG. 1, is formed, wherein the mask blank has a hard mask layer, e.g., ARC layer 160 in FIG. 1, and an absorber layer, e.g., absorber layer 150 in FIG. 1. The mask blank further includes a substrate, e.g., substrate 110 in FIG. 1, a multi-layer (ML) mirror, e.g., reflective multilayer 120 in FIG. 1 and a capping layer, e.g., capping layer 130 in FIG. 1. In some embodiments, the mask blank further includes an optional etch stop layer, e.g., etch stop layer 140 in FIG. 1. In some embodiments, the formation of the mask blank includes a series of deposition processes. For example, chemical vapor deposition (CVD), such as plasma-enhanced CVD (PECVD), high density plasma CVD (HDPCVD), low pressure CVD (LPCVD) or metal-organic vapor phase epitaxy (MOVPE), physical vapor deposition (PVD), such as magnetron sputtering, pulse laser deposition or e-beam evaporation, atomic layer deposition (ALD), platting or another suitable process.

The hard mask layer includes a single material. The hard mask layer is formed using a same deposition process as the absorber layer. In some embodiments, the hard mask layer is deposited in a same process chamber as the absorber layer. In some embodiments, the hard mask layer is deposited in a different process chamber from that used to deposit the absorber layer. In some embodiments, each layer of the mask blank is formed using a same deposition process as the other layers. In some embodiments, at least one layer of the mask blank is formed using a different deposition process from the other layers.

In comparison with other approaches, the etch stop layer helps to prevent the capping layer from being damaged, which causes an energy loss during the lithography process, in some instances. In some embodiments where the mask blank has the etch stop layer, the etch stop layer is between the capping layer and the absorber layer. In some embodiments wherein the mask blank is free of the etch stop layer, the absorber layer is directly deposited over the capping layer. In some embodiments, a conductive layer is additionally deposited at a backside of the substrate for an electrostatic chucking purpose. For example, an electrostatic chuck is negatively charged and the mask blank is positively charged. Such opposite charges provide an attractive force to hold the mask blank in place during the fabrication process.

Method 200 continues with operation 220 in which the hard mask layer is patterned to define a pattern image. A photosensitive layer, e.g., a photoresist, is coated over the hard mask layer, using a spin-on coating, a dip coating method or an air knife coating method, to pattern the hard mask layer with an integrated circuit pattern. Next, an e-beam or a laser writing is performed to define the pattern image. For example, the e-beam writing provides an electrical beam incident on a target surface and breaks polymers contained in the photosensitive layer into smaller fragments. The smaller fragments are then removed from the photosensitive layer to define openings in the photosensitive layer. In some embodiments, the photosensitive layer includes a quencher, a photo decomposable base (PDB) and a photo acid generator (PAG), which generates an acid after the exposure process. The quencher is a base molecule configured to neutralize the acid to quench a chemically amplified resist (CAR) in an exposure area. In some embodiments, the photosensitive layer has a thickness ranging from about 80 nm to about 120 nm. A greater thickness or a smaller thickness decreases a contrast and a resolution of the pattern image, in some instances. Next, a developing process is performed to selectively remove an exposed or unexposed region with a developer to define the pattern image.

Method 200 continues with operation 230 in which a first etch process is performed to remove a portion of the hard mask layer. The absorber layer has a relative higher etch selectivity than the hard mask layer during the first etch process so that the absorber layer is barely removed. The first etch process includes a wet etching, a dry etching, such as inductively coupled plasma (ICP), reactive ion etching (RIE) and plasma enhanced (PE) etching, or a combination thereof. In some embodiments where the hard mask layer includes tantalum boron oxide or tantalum silicon oxynitride, the ICP process is performed using an etchant comprising tetrafluoromethane or carbon tetrachloride. In some embodiments, the etchant includes only one etching gas. In comparison with other approaches which include multiple types of etchant gases, the reduced types of etching gas help to prevent the photosensitive layer from being damaged and/or harden during etching of the hard mask layer. In some embodiments, the etchant includes more than one etching gas, for example, a mixture of carbon tetrachloride and hydrogen. In some embodiments, a carrier gas, such as helium, argon or nitrogen, is used with the etchant in order to adjust and/or maintain a reaction pressure and etchant concentration. In some embodiments, a flow ratio of the etchant to the carrier gas is in a range from about 1:1 to about 1:10. A greater flow ratio increases a risk of damaging the photosensitive layer, in some instances. A smaller flow ratio extends the processing time and increases the manufacturing cost, in some instances. In some embodiments, the first etch process is performed at a pressure in a range from about 1 milli-Torr (mT) to about 10 mT. In some embodiments, a source power of the ICP process is in a range from about 200 watts to about 300 watts. In comparison with other approaches, because the hard mask layer, i.e., the ARC layer, is the top-most layer of the mask blank, method 200 avoids at least one pattern transfer step, resulting in an improved pattern fidelity and a reduced etching loading effect impacting a proximity trend, i.e., a difference between a target CD and an actual CD, of the image pattern. Further, in comparison with other approaches, sidewalls of a subsequent absorber stack are substantially free of oxide. In other approaches, the oxide causes a CD bias and worse pattern fidelity. Thus, in comparison with other approaches, method 200 results in an improved CD control.

Method 200 continues with operation 240 in which a second etch process is performed to remove a portion of the absorber layer defined by a remaining hard mask layer. In comparison with the first etch process, the hard mask layer has a sufficiently higher etch selectivity than the absorber layer during the second etch process so that only a minimal amount of the hard mask layer is removed during the second etch process. In some embodiments, the second etch process applies a same type of etch process as the first etch process. An etchant of the second etch process is different from that of the first etch process. In some embodiments where the absorber layer includes tantalum boron nitride or tantalum silicon, an ICP process is performed using a mixture of chlorine gas and oxygen. In some embodiments, a ratio of an etch selectivity of the etch stop layer to that of the absorber layer is in a range from about 1:4 to about 1:6. A smaller ratio increases a risk of over-etch during the second etch process when the etch stop layer is too thin, in some instances. In some embodiments where the absorber layer includes tantalum boron nitride and the etch stop layer includes silicon, both layers are removed using a same etchant by the ICP process. The ICP process is monitored through an optical emission spectroscopy (OES) measurement which detects a first signal generated from the removal of the etch stop layer and a second signal which relates to the capping layer. When the second signal is detected by the OES, the ICP process is terminated at the same time. In at least one embodiment where the etch stop layer includes silicon oxide, the second etch process only removes the absorber layer and stops when the silicon oxide etch stop layer is exposed.

In some embodiments, an order of operations in method 200 is modified. For example, a portion of the etch stop layer is removed using a third etch process until a top surface of the capping layer is exposed. In some embodiments, additional operations are included in method 200. As another example, at least one repairing process is performed after the fabrication of the mask blank, after the first etch process and/or after the second etch process.

FIGS. 3A-3D are cross-sectional views of a reflection mode mask 301 at various stages of manufacturing in accordance with one or more embodiments. Reflection mode mask 301 includes elements similar to mask blank 100 and a last two digits of like elements are the same.

FIG. 3A is a cross-sectional view of reflection mode mask 301 following operation 220 in accordance with one or more embodiments. Reflection mode mask 301 includes substrate 310, a reflective multilayer 320, a capping layer 330, an etch stop layer 340, an absorber layer 350 and an ARC layer 360. In some embodiments, ARC layer 360 has a thickness ranging from about 1 nm to about 5 nm. A greater thickness increases a formation of oxide byproduct during the etching process, in some instances. A smaller thickness provides insufficient reflectivity of incident radiation, in some instances. In some embodiments where ARC layer 360 includes tantalum boron oxide, the thickness ranges from about 2 nm to 3 nm. A photosensitive layer 370 is formed over ARC layer 360 after a series of process including spin-on coating, soft baking, aligning, exposing, post exposure baking, developing and hard baking, in some instances. Reflection mode mask 301 further includes a dark region 372 corresponding to a region where absorber layer 350 and ARC layer 360 are maintained and a clear region 374 configured to reflect incident radiation during the lithography process.

In some embodiments, a thickness of photosensitive layer 370 is in a range from about 80 nm to about 120 nm. A greater thickness increases an energy (dose) of an e-beam writer, in some instances. A smaller thickness increases a risk of over exposure phenomenon, in some instances. In comparison with other approaches, photosensitive layer 370 is thinner so that photosensitive layer 370 has a more homogenous depth profile during the exposure, resulting in an enhanced image resolution. In at least one embodiment, the image resolution is approximately 40 nm.

FIG. 3B is a cross-sectional view of reflection mode mask 301 following operation 230 in accordance with one or more embodiments. A portion of ARC layer 360 defined by dark region 372 is removed using a first etch process. As a result, a portion of absorber layer 350 corresponding to clear region 374 is exposed after the first etch process. In comparison with other approaches, at least one exposure and one etch process is removed because ARC layer 360 also functions as a hard mask layer, thereby helping to reduce contamination by particles caused during the lithography process. In addition, the simplified process improves CD mean to target (MTT), thereby enhancing a resolution of mask 301.

Next, in FIG. 3C, photosensitive layer 370 is no longer needed because the remained ARC layer 360 has been patterned and configured to serve as a hard mask layer. In some embodiments, photosensitive layer 370 is removed from reflection mode mask 301 using wet stripping or plasma ashing.

FIG. 3D is a cross-sectional view of reflection mode mask 301 following operation 240 in accordance with one or more embodiments. The exposed absorber layer 350 defined by ARC layer 360 is removed using a second etch process. In some embodiments, a portion of etch stop layer 340 underneath the removed portion of absorber layer 350 is further removed using a third etch process. In some instances, the second etch process is the same as the third etch process. In some instances, the second etch process is different from the third etch process. Afterwards, a plurality of absorber stacks 376 is formed over reflective multilayer 320.

In comparison with other approaches, a relatively thinner ARC layer 360 helps to avoid a formation of undercut at absorber layer 350. In addition, in other approaches, an oxide byproduct is accumulated during the first etch process and is attached along sidewalls of absorber stacks 376, thereby decelerating an efficiency of the second etch process. Thus, the relatively thinner ARC layer 360 helps to reduce the generation of the oxide byproduct, and the sidewalls of absorber stack 376 are substantially free of oxide, e.g., boron oxide when ARC layer 360 is made of tantalum boron oxide. In at least one instance, a roughness of sidewalls of absorber stacks 376 is calculated by measuring a width of a plurality of absorber stacks 376 at several points along each absorber stack 376. The measured widths are then averaged to obtain an average feature width. The roughness is defined by a difference between a greatest measured width and an average width. In some embodiments, because a sidewall of absorber layer 350 is substantially free of oxide byproduct, the sidewall roughness of each absorber stack 376 is smaller than 3 nm, improving the image fidelity.

FIGS. 4A-4B are cross-sectional views of a reflection mode mask 401 in accordance with one or more embodiments. Reflection mode mask 401 includes elements similar to mask blank 100 and a last two digits of like elements are the same. In comparison with reflection mode mask 301, in FIG. 4A, because an etch stop layer 440 is transparent to the selected range of wavelengths during the lithography process, etch stop layer 440 remained after the second etch process; in FIG. 4B, etch stop layer 440 is partially removed during the second etch process. Further, in some embodiments where a capping layer 430 includes ruthenium and a top-most film of a reflective multilayer 420 includes silicon, a combination of silicon/ruthenium/silicon helps to increase a reflectivity of EUV radiation.

FIG. 5 is a cross-sectional view of a reflection mode mask 501 in accordance with one or more embodiments. Reflection mode mask 501 includes elements similar to mask blank 100 and a last two digits of like elements are the same. In comparison with reflection mode mask 301, reflection mode mask 501 is free of an etch stop layer.

It is understood that each of mask blank 100 and reflection mode mask 301/401 undergoes further fabrication process flow to form various features, such a pellicle frame, a pellicle membrane, a thinned substrate, or the like.

One aspect of this description relates to a method of fabricating a mask blank. The method includes depositing a reflective multilayer over a substrate, depositing a capping layer over the reflective multilayer, depositing an absorber layer over the capping layer, and depositing an ARC layer over the absorber layer. The ARC layer is a single material film. In some embodiments, the depositing of the ARC layer over the absorber layer includes depositing the ARC layer so that a ratio of a thickness of the ARC layer to the absorber layer is in a range from about 0.015 to about 0.075. In some embodiments, the depositing of the ARC layer over the absorber layer includes depositing the ARC layer to have a thickness ranging from about 1 nm to about 5 nm. In some embodiments, the method further includes depositing an etch stop layer over the capping layer, wherein a thickness of the etch stop layer ranges from about 2 nm to about 5 nm. In some embodiments, the depositing of the etch stop layer includes depositing the etch stop layer so that a ratio of an etch selectivity of the etch stop layer to that of the capping layer is equal to or smaller than 1:20.

Another aspect of this description relates to a method of manufacturing a reticle. The method includes depositing an absorber layer over a substrate, depositing a hard mask over the absorber layer, coating a photoresist directly over the hard mask layer, and patterning the photoresist to expose a portion of the hard mask layer. The hard mask layer includes tantalum. In some embodiments, the method further includes performing a first etch process to remove the exposed portion of the hard mask layer, stripping the photoresist, and performing a second etch process to remove a portion of the absorber layer underneath the removed portion of the hard mask. In some embodiments, the performing of the first etch process includes flowing a mixture of tetrafluoromethane and a carrier gas on the exposed portion of the hard mask layer. In some embodiments, the performing of the second etch process includes using a different etchant than that of the first etch process. In some embodiments, the method further includes depositing a reflective multilayer over the substrate, depositing a capping layer over the reflective multilayer, and depositing an etch stop layer over the capping layer. An etch selectivity of the etch stop layer is greater than that of the absorber layer during the first etch process and is smaller than that of the capping layer during the second etch process. In some embodiments, the method further includes performing a third etch process to remove a portion of the etch stop layer underneath the removed portion of the absorber layer. In some embodiments, the performing of the third etch process includes using a same etchant as that of the second etch process. In some embodiments, the performing of the third etch process includes receiving an optical emission spectroscopy measurement to detect an endpoint. In some embodiments, the coating of the photoresist includes coating a photoresist including a CAR over the hard mask layer, wherein a thickness of the photoresist is in a range from about 80 nm to about 120 nm.

Still another aspect of this description relates to a reflection mode photomask. The reflection mode photomask includes a substrate, a reflective multilayer over the substrate, and a plurality of absorber stacks over the reflective multilayer. Each absorber stack of the plurality of absorber stacks has an etch stop layer, an absorber layer and an ARC layer, wherein a ratio of a thickness of the ARC layer to that of the etch stop layer is in a range from about 1:1 to about 1:2.5. In some embodiments, a sidewall roughness of each absorber stack of the plurality of absorber stacks is smaller than 3 nm. In some embodiments, the etch stop layer is configured to reflect light at a wavelength from about 200 nm to about 350 nm. In some embodiments, a thickness of the etch stop layer is in a range from about 1 nm to about 5 nm. In some embodiments, the ARC layer includes tantalum boron oxide and the absorber layer includes tantalum boron nitride. In some embodiments, a sidewall of the absorber stack is substantially free of boron oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a mask blank, the method comprising:
   depositing a reflective multilayer over a substrate;
   depositing a capping layer over the reflective multilayer;
   depositing an etch stop layer over the capping layer, wherein the etch stop layer comprises silicon or silicon compounds, the etch stop layer has a thickness greater than 2 nanometers (nm) to about 5 nm, and the etch stop layer is configured to reflect light having a wavelength from about 200 nanometers (nm) to about 350 nm;
   depositing an absorber layer over the etch stop layer; and
   depositing an anti-reflective coating (ARC) layer over the absorber layer, wherein the ARC layer is a single material film.

2. The method of claim 1, wherein the depositing the ARC layer over the absorber layer comprises:
   depositing the ARC layer so that a ratio of a thickness of the ARC layer to the absorber layer is in a range from about 0.015 to about 0.075.

3. The method of claim 1, wherein the depositing the ARC layer over the absorber layer comprises:
   depositing the ARC layer to have a thickness ranging from about 1 nanometer (nm) to about 5 nm.

4. The method of claim 1, wherein the depositing the etch stop layer comprises:
   depositing the etch stop layer so that a ratio of an etch selectivity of the etch stop layer to that of the capping layer is equal to or smaller than 1:20.

5. The method of claim 1, wherein depositing the etch stop layer comprises depositing the etch stop layer is silicon.

6. A method of manufacturing a reticle, the method comprising:
   depositing an absorber layer over a substrate;
   depositing a hard mask layer over the absorber layer, wherein the hard mask layer includes tantalum;
   coating a photoresist directly over the hard mask layer;
   patterning the photoresist to expose a portion of the hard mask layer; performing a first etch process to remove the exposed portion of the hard mask;
   performing a second etch process to remove a portion of the absorber layer underneath the removed portion of the hard mask; and
   performing a third etch process to partially remove a portion of a thickness of an etch stop layer underneath the removed portion of the absorber layer, wherein performing the third etch process comprises maintaining a remaining thickness of the etch stop layer underneath the removed portion of the absorber; and
   maintaining the remaining thickness of the etch stop layer through a termination of the method of manufacturing the reticle.

7. The method of claim 6, further comprising:
   stripping the photoresist after the first etch process.

8. The method of claim 7, further comprising:
   depositing a reflective multilayer over the substrate;
   depositing a capping layer over the reflective multilayer; and
   depositing the etch stop layer over the capping layer, wherein an etch selectivity of the etch stop layer is greater than that of the absorber layer during the first etch process and is smaller than that of the capping layer during the second etch process.

9. The method of claim 8, wherein the third etch process fails to expose the capping.

10. The method of claim 6, wherein the performing the first etch process comprises:
    flowing a mixture of tetrafluoromethane and a carrier gas on the exposed portion of the hard mask layer.

11. The method of claim 6, wherein the performing the second etch process comprises:
    using a different etchant than that of the first etch process.

12. The method of claim 6, wherein the performing the third etch process comprises:
    using a same etchant as that of the second etch process.

13. The method of claim 6, wherein the performing the third etch process comprises:
    receiving an optical emission spectroscopy (OES) measurement to detect an endpoint.

14. The method of claim 6, wherein the coating the photoresist comprises:
    coating a photoresist including a chemically-amplified resist (CAR) over the hard mask layer, wherein a thickness of the photoresist is in a range from about 80 nm to about 120 nm.

* * * * *